US010676643B2

(12) United States Patent
Kato et al.

(10) Patent No.: US 10,676,643 B2
(45) Date of Patent: Jun. 9, 2020

(54) COATING FILM-FORMING COMPOSITION AND PROCESS FOR PRODUCING THE SAME

(71) Applicant: NISSAN CHEMICAL INDUSTRIES, LTD., Tokyo (JP)

(72) Inventors: Taku Kato, Funabashi (JP); Masayoshi Suzuki, Funabashi (JP); Natsumi Murakami, Sodegaura (JP); Daiki Iijima, Sodegaura (JP); Tomoki Furukawa, Sodegaura (JP); Yoshinari Koyama, Sodegaura (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 57 days.

(21) Appl. No.: 16/089,562

(22) PCT Filed: Mar. 27, 2017

(86) PCT No.: PCT/JP2017/012367
§ 371 (c)(1),
(2) Date: Sep. 28, 2018

(87) PCT Pub. No.: WO2017/170385
PCT Pub. Date: Oct. 5, 2017

(65) Prior Publication Data
US 2019/0144707 A1 May 16, 2019

(30) Foreign Application Priority Data
Mar. 31, 2016 (JP) .................................. 2016-073598

(51) Int. Cl.
C09D 183/04 (2006.01)
C09C 3/12 (2006.01)
G02B 3/00 (2006.01)
C09D 183/02 (2006.01)
G02B 1/10 (2015.01)
C09D 185/00 (2006.01)
C09C 1/36 (2006.01)
C09C 3/00 (2006.01)
C09C 1/00 (2006.01)
G02B 1/14 (2015.01)
C09D 7/40 (2018.01)
C09D 7/62 (2018.01)
C08K 3/22 (2006.01)
C08K 3/36 (2006.01)
C08K 9/02 (2006.01)
C08K 9/06 (2006.01)
H01L 27/146 (2006.01)

(52) U.S. Cl.
CPC ............. *C09D 183/04* (2013.01); *C08K 3/22* (2013.01); *C08K 3/36* (2013.01); *C08K 9/02* (2013.01); *C08K 9/06* (2013.01); *C09C 1/0081* (2013.01); *C09C 1/3661* (2013.01); *C09C 1/3684* (2013.01); *C09C 3/006* (2013.01); *C09C 3/12* (2013.01); *C09D 7/62* (2018.01); *C09D 7/67* (2018.01); *C09D 183/02* (2013.01); *C09D 185/00* (2013.01); *G02B 1/10* (2013.01); *G02B 1/14* (2015.01); *G02B 3/00* (2013.01); *H01L 27/1462* (2013.01); *C01P 2004/64* (2013.01); *C08K 2003/2241* (2013.01); *C08K 2201/011* (2013.01)

(58) Field of Classification Search
CPC ... C09C 1/3684; C09C 1/3653; C09C 1/3045; C09C 1/3054; C09C 1/3081; C09C 3/006; C09C 3/12
See application file for complete search history.

(56) References Cited

U.S. PATENT DOCUMENTS

| 8,748,001 | B2 | 6/2014 | Muraguchi et al. | |
|---|---|---|---|---|
| 2004/0115955 | A1 | 6/2004 | Motoyama et al. | |
| 2010/0099790 | A1 | 4/2010 | Manabe et al. | |
| 2012/0313056 | A1* | 12/2012 | Baran | H01B 1/22 252/519.21 |
| 2014/0179800 | A1* | 6/2014 | Liu | A61K 31/122 514/690 |
| 2015/0274938 | A1* | 10/2015 | Okawa | C08L 83/00 257/100 |
| 2015/0337161 | A1 | 11/2015 | Haraguchi et al. | |

(Continued)

FOREIGN PATENT DOCUMENTS

| EP | 1041404 A2 | 10/2000 |
|---|---|---|
| EP | 1391491 A1 | 2/2004 |

(Continued)

OTHER PUBLICATIONS

"Surface Modification of gamma-Fe2O3@SiO2 Magnetic Nanoparticles for the Controlled Interaction with Biomolecules" authored by De Palma et al. and published in the Journal of Nanoscience and Nanotechnology (2007) 7, 4626-4641.*
May 16, 2017 International Search Report issued in International Patent Application No. PCT/JP2017/012367.
May 16, 2017 Written Opinion issued in International Patent Application No. PCT/JP2017/012367.
Dec. 18, 2019 Extended European Search Report issued in European Patent Application No. 17774922.3.

(Continued)

Primary Examiner — Marc S Zimmer
(74) Attorney, Agent, or Firm — Oliff PLC

(57) ABSTRACT

A coating film-forming composition includes a hydrolysis-condensation product of a hydrolyzable silane and fine inorganic particles subjected to a special dispersion treatment, that can be formed into a highly heat-resistant, highly transparent coating film capable of exhibiting a high refractive index and having a large thickness and excellent storage stability as a coating composition; and a process for producing the coating film-forming composition.

15 Claims, No Drawings

(56) References Cited

U.S. PATENT DOCUMENTS

| | | | | |
|---|---|---|---|---|
| 2016/0136307 A1* | 5/2016 | Wei | ............. | A61K 49/1839 |
| | | | | 424/9.323 |
| 2016/0237299 A1* | 8/2016 | Jing | ............. | C08K 5/3412 |
| 2018/0105714 A1* | 4/2018 | Kasperchik | ............. | C09D 11/54 |
| 2018/0147777 A1* | 5/2018 | Abbott, Jr. | ............. | B33Y 70/00 |

FOREIGN PATENT DOCUMENTS

| | | |
|---|---|---|
| EP | 2151443 A1 | 2/2010 |
| EP | 2213623 A1 | 8/2010 |
| EP | 2308803 A1 | 4/2011 |
| EP | 2527293 A1 | 11/2012 |
| EP | 2724984 A1 | 4/2014 |
| JP | 2001-354853 A | 12/2001 |
| JP | 2003-031569 A | 1/2003 |
| JP | 2007-246877 A | 9/2007 |
| JP | 2009-056387 A | 3/2009 |
| JP | 2013-234333 A | 11/2013 |
| WO | 2002/088267 A1 | 11/2002 |
| WO | 2008/133138 A1 | 11/2008 |
| WO | 2014/069634 A1 | 5/2014 |

* cited by examiner

COATING FILM-FORMING COMPOSITION AND PROCESS FOR PRODUCING THE SAME

TECHNICAL FIELD

The present invention relates to a coating film-forming composition and a process for producing the same and more particularly relates to a coating film-forming composition containing a hydrolysis-condensation product of a hydrolyzable silane and fine inorganic particles to which an amphiphilic organic silicon compound is bonded and to a process for producing the coating film-forming composition.

BACKGROUND ART

Attempts to improve the performance of polymer compounds have hitherto been made in various ways. For example, to increase the refractive index of polymer compounds, introduction of an aromatic ring, halogen atom, or sulfur atom has been attempted. In particular, episulfide polymer compounds and thiourethane polymer compounds having introduced sulfur atom are used in high-refractive-index lenses for eyeglasses.

However, it is difficult to design a material with a refractive index higher than 1.7 by using a polymer alone. Thus, a method using fine inorganic particles has been known as the most effective method that can achieve a further increase in refractive index.

In this method, a polymer and fine inorganic particles are mixed to achieve a high refractive index. A common technique for the mixing is to mix a solution of the polymer and a dispersion of the fine inorganic particles. In this case, the polymer serves as a binder to stabilize the dispersion state of the fine inorganic particles without impairment of the dispersion state.

It has been reported that a hydrolysis-condensation product of a hydrolyzable silane or a polyimide can be used as the binder polymer as described above. For example, a technique has been reported in which a hybrid material prepared by mixing a hydrolysis-condensation product of an alkoxysilane and an inorganic oxide dispersion containing dispersed zirconia or titania is used to achieve an increase in refractive index (see Patent Document 1). There has also been reported a technique in which a hybrid material containing a polyimide and dispersed titania, zinc sulfide or the like is used to achieve an increase in refractive index (see Patent Document 2).

Although these hybrid materials are deliberately designed to achieve a high refractive index, any high-refractive-index composition having a refractive index higher than 1.7 and capable of providing a film thickness of more than 1 µm has not yet been obtained. Furthermore, no investigation as to the storage stability of coating compositions has been conducted.

In recent years, high-performance hybrid materials are increasingly required for development of electronic devices such as liquid crystal displays, organic electroluminescence (EL) displays, optical semiconductor (LED) devices, solid-state image sensors, organic thin-film solar cells, dye-sensitized solar cells, and organic thin-film transistors (TFT).

Specific examples of required properties include heat resistance, transparency, high refractive index, large film thickness, crack resistance, and coating composition storage stability.

Mixing of a hydrolysis-condensation product of a hydrolyzable silane, namely a polysiloxane, with fine inorganic particles generally results in a film having high heat resistance and high transparency. A common approach to increasing the refractive index of the film is to reduce the content ratio of the polysiloxane which has a low refractive index and increase the content ratio of the fine inorganic particles which have a high refractive index. A common approach to increasing the film thickness is to increase the solids concentration of the coating composition containing the polysiloxane and the fine inorganic particles.

The approach to increasing the film thickness by increasing the solids concentration of a coating composition is based on the theory that the increase in solids concentration can yield an increase in viscosity of the coating composition and that a film formed from the coating composition of high viscosity can be a thick film. This approach is suitable when an organic polymer such as an acrylic polymer is used.

However, the viscosity of a coating composition containing a polysiloxane and fine inorganic particles is not readily increased by increasing the solids concentration; namely, the viscosity of the composition remains low at the time of film formation, and thus it is difficult to achieve a large film thickness. Furthermore, when attempting to achieve a high refractive index of the composition along with a large film thickness, the content of the fine inorganic particles in the coating composition needs to be increased, as described above, to increase the refractive index, which makes it more difficult to increase the viscosity of the coating composition. This is because fine inorganic particles selected for use in a coating composition in the art are well dispersed in the coating composition and such fine inorganic particles of high dispersibility make it difficult to increase the viscosity of the composition.

It may be possible to increase the thickness of a film of a composition containing a hydrolysis-condensation product of a hydrolyzable silane and fine inorganic particles by increasing the dispersed particle diameter of the fine inorganic particles and thus increasing the viscosity of the coating composition.

However, this approach, which indeed allows an increase in film thickness, has the disadvantage of deteriorating the storage stability of the coating composition and cannot ensure a long product life of the composition. A coating composition with poor storage stability is, for example, not resistant to viscosity increase during storage of the coating composition, which leads to an undesired situation such as where the film thickness cannot be controlled to a target thickness or where the composition turns into a gel and becomes unusable.

As seen from the foregoing description, a technical trade-off exists between achievement of increase in thickness of a film of a composition containing a polysiloxane and fine inorganic particles and achievement of high storage stability of the composition.

As described above, there has been no report of any coating composition that comprises a polysiloxane and fine inorganic particles, that can be formed into a highly heat-resistant, highly transparent coating film capable of exhibiting a high refractive index and having a large thickness and crack resistance and excellent storage stability, or of any process for producing such a composition.

PRIOR ART DOCUMENTS

Patent Document

Patent Document 1: Japanese Patent Application Publication No. 2007-246877 (JP 2007-246877 A)
Patent Document 2: Japanese Patent Application Publication No. 2001-354853 (JP 2001-354853 A)

SUMMARY OF THE INVENTION

Problem to be Solved by the Invention

The present invention has been made in view of these circumstances, and an object of the present invention is to provide: a coating film-forming composition that comprises a hydrolysis-condensation product of a hydrolyzable silane and fine inorganic particles, that can be formed into a highly heat-resistant, highly transparent coating film capable of exhibiting a high refractive index and having a large thickness and excellent storage stability as a coating composition; and a process for producing the coating film-forming composition.

Means for Solving the Problem

The present inventors have completed the present invention based on the finding that a composition containing a hydrolysis-condensation product of a hydrolyzable silane and fine inorganic particles subjected to a particular dispersibility-related treatment is suitable as a coating film-forming composition for use in production of electronic devices.

That is, the present invention provides the following.

1. A coating film-forming composition comprising the following components (A) and (B):
(A) a hydrolysis-condensation product of at least one hydrolyzable silane of the following formula (1):

$$R^2{}_a Si(OR^1)_{4-a} \qquad \text{formula (1)}$$

wherein $R^1$ is a $C_{1-6}$ alkyl group, $R^2$ is a $C_{1-18}$ alkyl group or a $C_{6-18}$ aryl group, and a is an integer of 0 to 3; and
(B) fine inorganic particles including modified colloidal metal oxide particles (B3) having a primary particle diameter of 2 to 100 nm, the modified colloidal metal oxide particles (B3) including: colloidal metal oxide particles (B1) having a primary particle diameter of 2 to 60 nm and serving as core particles; and a coating material (B2) coating the surface of the colloidal metal oxide particles (B1) and including colloidal metal oxide particles having a primary particle diameter of 1 to 4 nm, wherein an amphiphilic organic silicon compound is bonded to the surface of the modified colloidal metal oxide particles (B3), the amphiphilic organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

2. The coating film-forming composition according to 1, wherein in the formula (1), $R^2$ is methyl group, ethyl group, phenyl group, biphenyl group, or phenanthryl group, and a is 1.

3. The coating film-forming composition according to 1 or 2, wherein in the amphiphilic organic silicon compound, the number of moles of the oxyalkylene group as the hydrophilic group is 3 to 40 moles.

4. The coating film-forming composition according to any one of 1 to 3, wherein a mass percentage of the amphiphilic organic silicon compound bonded to the surface of the modified colloidal metal oxide particles (B3) of the component (B) is 3 to 30% by mass based on all metal oxides in the modified colloidal metal oxide particles (B3).

5. The coating film-forming composition according to any one of 1 to 4, wherein the colloidal metal oxide particles (B1) of the component (B) are an oxide of at least one metal selected from the group consisting of Ti, Fe, Cu, Zn, Y, Zr, Nb, Mo, In, Sn, Sb, Ta, W, Pb, Bi, and Ce.

6. The coating film-forming composition according to any one of 1 to 5, wherein the coating material (B2) of the component (B) is an oxide of at least one metal selected from the group consisting of Si, Al, Sn, Zr, Mo, Sb, and W.

7. A process for producing a coating film-forming composition, comprising a step of mixing the following components (A) and (B):
(A) a hydrolysis-condensation product of at least one hydrolyzable silane of the following formula (1).

$$R^2{}_a Si(OR^1)_{4-a} \qquad \text{formula (1)}$$

wherein $R^1$ is a $C_{1-6}$ alkyl group, $R^2$ is a $C_{1-18}$ alkyl group or a $C_{6-18}$ aryl group, and a is an integer of 0 to 3; and
(B) fine inorganic particles comprising modified colloidal metal oxide particles (B3) having a primary particle diameter of 2 to 100 nm, the modified colloidal metal oxide particles (B3) including: colloidal metal oxide particles (B1) having a primary particle diameter of 2 to 60 nm and serving as core particles; and a coating material (B2) coating the surface of the colloidal metal oxide particles (B1) and including colloidal metal oxide particles having a primary particle diameter of 1 to 4 nm, wherein an amphiphilic organic silicon compound is bonded to the surface of the modified colloidal metal oxide particles (B3), the amphiphilic organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

8. The process for producing a coating film-forming composition according to 7, wherein in the formula (1), $R^2$ is methyl group, ethyl group, phenyl group, biphenyl group, or phenanthryl group, and a is 1.

9. The process for producing a coating film-forming composition according to 7 or 8, wherein in the amphiphilic organic silicon compound, the number of moles of the oxyalkylene group as the hydrophilic group is 3 to 40 moles.

10. The process for producing a coating film-forming composition according to any one of 7 to 9, comprising a step of heating at 23° C. or higher and 150° C. or lower after the step of mixing the component (A) and the component (B).

11. A coating film obtained from the coating film-forming composition according to any one of 1 to 6.

12. An electronic device comprising a substrate and a coating film according to 11 formed on the substrate.

13. An optical member comprising a substrate and a coating film according to 11 formed on the substrate.

14. A solid-state image sensor or charge-coupled device comprising a complementary metal oxide semiconductor including at least one layer of the coating film according to 11.

15. An embedded material, planarizing material, or microlens material for solid-state image sensors, comprising at least one layer of the coating film according to 11.

Effects of the Invention

According to the present invention, a coating film-forming composition is obtained by mixing the following components (A) and (B):

(A) a hydrolysis-condensation product of at least one hydrolyzable silane of the following formula (1):

$$R^2_a Si(OR^1)_{4-a} \quad \text{formula (1)}$$

wherein $R^1$ is a $C_{1-6}$ alkyl group, $R^2$ is a $C_{1-18}$ alkyl group or a $C_{6-18}$ aryl group, and a is an integer of 0 to 3; and (B) fine inorganic particles comprising modified colloidal metal oxide particles (B3) having a primary particle diameter of 2 to 100 nm, the modified colloidal metal oxide particles (B3) including: colloidal metal oxide particles (B1) having a primary particle diameter of 2 to 60 nm and serving as core particles; and a coating material (B2) coating the surface of the colloidal metal oxide particles (B1) and including colloidal metal oxide particles having a primary particle diameter of 1 to 4 inn, wherein an amphiphilic organic silicon compound is bonded to the surface of the modified colloidal metal oxide particles (B3), the amphiphilic organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

When a coating film is formed from the coating film-forming composition, the obtained coating film has high heat resistance and transparency and thus exhibits high long-term reliability when placed in an electronic device.

To obtain a coating film with a high refractive index, the coating film-forming composition may be such that the content ratio of the high-refractive-index fine inorganic particles subjected to a particular dispersibility-related treatment (component (B)) is higher than the content of the low-refractive-index hydrolysis-condensation product of the hydrolyzable silane (component (A)). In this case, an increase in film thickness can also be achieved due to increase in viscosity of the composition. The coating film-forming composition has high storage stability, and the coating film obtained from the composition exhibits a high refractive index and high transparency.

According to the present invention, a highly heat-resistant, highly transparent coating film capable of exhibiting a high refractive index and having a large thickness and crack resistance can be formed from a composition comprising the component (A) and the component (B), and this composition can be provided as a coating film-forming composition having excellent storage stability.

As for the range of the refractive index of the coating film obtained from the coating film-forming composition according to the present invention, the lower limit, which depends on the situation where the coating film is used, is preferably 1.70 or higher, more preferably 1.75 or higher, and even more preferably 1.80 or higher. The upper limit, which is not particularly limited, may be 2.00 or lower or 1.95 or lower. In the present invention, the term "high refractive index" is defined to mean that the refractive index at a wavelength of 550 nm is 1.70 or higher.

The coating film-forming composition according to the present invention can have an increased viscosity as compared to conventional compositions containing a hydrolysis-condensation product of a hydrolyzable silane and fine inorganic particles, and can therefore be formed into a thick film. The coating film-forming composition according to the present invention allows a wide process margin because a thick film can be obtained from this composition, for example, without having to apply the composition twice by spin coating or use a complicated spin-coating recipe.

In the coating film-forming composition according to the present invention, the fine inorganic particles maintain high dispersibility. Thus, the coating film-forming composition has good storage stability and does not undergo sharp viscosity increase or gelation during storage. The composition therefore has a long product life, which eventually allows a reduction in cost.

With the coating film-forming composition according to the present invention, the film thickness, refractive index, and transmittance can be controlled by changing the type of the hydrolysis-condensation product of the hydrolyzable silane or changing the amount of the hydrolysis-condensation product added.

A coating film produced using the coating film-forming composition according to the present invention which has the features as described above is suitable for use as a member in production of electronic devices such as liquid crystal displays, organic electroluminescence (OLED) displays, optical semiconductor (LED) devices, solid-state image sensors, organic thin-film solar cells, dye-sensitized solar cells, and organic thin-film transistors (TFT). The coating film is suitable also for use as a lens member required to have a high refractive index. In particular, the coating film is suitable for use as a member for solid-state image sensors which is required to have a high refractive index, and the examples of such a member include: an embedded film and planarizing film on a photodiode; planarizing films on both sides of a color filter; and a planarizing film and conformal film on a microlens.

MODES FOR CARRYING OUT THE INVENTION

Hereinafter, the present invention will be described in more detail.

<Component (A)>

The hydrolyzable silane hydrolysis-condensation product contained as the component (A) in the coating film-forming composition according to the present invention is a polysiloxane formed through dehydration condensation of silanol groups of a hydrolysate of at least one hydrolyzable silane of the following formula (1):

$$R^2_a Si(OR^1)_{4-a} \quad \text{formula (1)}$$

wherein $R^1$ is a $C_{1-6}$ alkyl group, $R^2$ is a $C_{1-18}$ alkyl group or a $C_{6-18}$ aryl group, and a is an integer of 0 to 3.

An example of the alkyl group $R^1$ in the formula (1) is a $C_{1-6}$ alkyl group having a linear, branched, or cyclic alkyl moiety, and examples of the alkyl group include methyl group, ethyl group, n-propyl group, isopropyl group, n-butyl group, isobutyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, and 1-ethyl-2-methyl-n-propyl group.

The $C_{1-18}$ alkyl group $R^2$ in the formula (1) has a linear, branched, or cyclic alkyl moiety, and examples of the alkyl group include methyl group, ethyl group, n-propyl group, isopropyl group, n-butyl group, isobutyl group, s-butyl group, t-butyl group, n-pentyl group, 1-methyl-n-butyl group, 2-methyl-n-butyl group, 3-methyl-n-butyl group, 1,1-dimethyl-n-propyl group, 1,2-dimethyl-n-propyl group, 2,2-dimethyl-n-propyl group, 1-ethyl-n-propyl group, n-hexyl group, 1-methyl-n-pentyl group, 2-methyl-n-pentyl group, 3-methyl-n-pentyl group, 4-methyl-n-pentyl group, 1,1-dimethyl-n-butyl group, 1,2-dimethyl-n-butyl group, 1,3-dimethyl-n-butyl group, 2,2-dimethyl-n-butyl group, 2,3-dimethyl-n-butyl group, 3,3-dimethyl-n-butyl group, 1-ethyl-n-butyl group, 2-ethyl-n-butyl group, 1,1,2-trimethyl-n-propyl group, 1,2,2-trimethyl-n-propyl group, 1-ethyl-1-methyl-n-propyl group, 1-ethyl-2-methyl-n-propyl group, heptyl group, octyl group, nonyl group, decyl group, undecyl group, dodecyl group, tridecyl group, tetradecyl group, pentadecyl group, hexadecyl group, heptadecyl group, and octadecyl group.

Examples of the $C_{6-18}$ aryl group $R^2$ in the formula (1) include phenyl group, naphthyl group, anthracenyl group, phenanthryl group, biphenyl group, terphenyl group, and cyclohexyl group.

Examples of the hydrolyzable silane of the formula (1) include, but are not limited to, tetramethoxysilane, tetraethoxysilane, tetra-n-propoxysilane, tetraisopropoxysilane, tetra-n-butoxysilane, methyltrimethoxysilane, methyltriethoxysilane, ethyltrimethoxysilane, ethyltriethoxysilane, n-propyltriethoxysilane, isobutyltriethoxysilane, t-butyltriethoxysilane, n-octyltriethoxysilane, phenyltrimethoxysilane, phenyltriethoxysilane, phenanthryltrimethoxysilane, biphenyltrimethoxysilane, and dimethoxydimethylsilane.

For the hydrolyzable silane hydrolysis-condensation product as the component (A), the hydrolyzable silane of the formula (1) may be used in combination with another hydrolyzable silane compound such as tetrachlorosilane which has a halogen atom as a hydrolyzable group.

In the formula, the subscript a of $R^2$ is an integer of 0 to 3; that is, the hydrolysis-condensation product of the hydrolyzable silane of the formula (1) is a tetrafunctional, trifunctional, or difunctional polysiloxane.

In particular, when a silsesquioxane in which $R^2$ is methyl group, ethyl group, phenyl group, or biphenyl group and a is 1 is selected as the hydrolysis-condensation product, the resulting thick film has a significantly improved crack resistance.

The weight-average molecular weight of the hydrolysis-condensation product of the at least one hydrolyzable silane of the formula (1) is, for example, 1,000 to 100,000. The molecular weight is an average molecular weight determined by gel permeation chromatography (hereinafter abbreviated as "GPC") based on polystyrene standards.

Examples of the hydrolysis catalyst used for synthesis of the hydrolysis-condensation product include an organic acid, an inorganic acid, an organic base, and an inorganic base.

Examples of the organic acid include acetic acid, propionic acid, butanoic acid, pentanoic acid, hexanoic acid, heptanoic acid, octanoic acid, nonanoic acid, decanoic acid, oxalic acid, maleic acid, methylmalonic acid, adipic acid, sebacic acid, gallic acid, butyric acid, mellitic acid, arachidonic acid, 2-ethylhexanoic acid, oleic acid, stearic acid, linoleic acid, linolenic acid, salicylic acid, benzoic acid, p-aminobenzoic acid, p-toluenesulfonic acid, benzenesulfonic acid, monochloroacetic acid, dichloroacetic acid, trichloroacetic acid, trifluoroacetic acid, formic acid, malonic acid, sulfonic acid, phthalic acid, fumaric acid, citric acid, and tartaric acid. Examples of the inorganic acid include hydrochloric acid, nitric acid, sulfuric acid, hydrofluoric acid, and phosphoric acid. Examples of the organic base include pyridine, pyrrole, piperazine, pyrrolidine, piperidine, picoline, trimethylamine, triethylamine, monoethanolamine, diethanolamine, dimethyl monoethanolamine, monomethyl diethanolamine, triethanolamine, diazabicyclooctane, diazabicyclononane, diazabicycloundecene, tetramethylammonium hydroxide, and 1,8-diazabicyclo[5,4,0]-7-undecene. Examples of the inorganic base include ammonia, sodium hydroxide, potassium hydroxide, barium hydroxide, and calcium hydroxide. Among these catalysts, organic acids and inorganic acids are preferred. One catalyst may be used alone or two or more catalysts may be used together.

For hydrolysis of alkoxy groups (hereinafter referred to as "hydrolyzable groups") bonded to silicon atoms in the hydrolyzable silane, water is used in an amount of 0.1 to 100 moles, 0.1 to 10 moles, 1 to 5 moles, or 2 to 3.5 moles per mole of the hydrolyzable groups. Furthermore, a hydrolysis catalyst can be used in an amount of 0.0001 to 10 moles, preferably in an amount of 0.001 to 2 moles, per mole of the hydrolyzable groups.

The reaction temperature in hydrolysis of the hydrolyzable silane and the subsequent condensation is typically equal to or higher than 23° C. (room temperature) and equal to or lower than the reflux temperature at ordinary pressure of the organic solvent used for hydrolysis.

The hydrolyzable silane may be completely hydrolyzed; namely, all of the hydrolyzable groups may be converted to silanol groups. Alternatively, the hydrolyzable silane may be partially hydrolyzed; namely, some of the hydrolyzable groups may remain unreacted. Uncondensed hydrolysate may remain after the hydrolysis and condensation reaction.

Examples of the method for obtaining the hydrolysis-condensation product of the hydrolyzable silane include, but are not limited to, a method in which a mixture of the hydrolyzable silane compound, an organic solvent, water, and a hydrolysis catalyst is heated.

Specifically, oxalic acid (hydrolysis catalyst) and water are first added to an alcohol (organic solvent) to prepare a solution of oxalic acid, then the solution and hydrolyzable silane compound and mixed, and the mixture is heated. In this case, the amount of oxalic acid is typically 0.2 to 2 moles per mole of all hydrolyzable groups (such as alkoxy groups) of the hydrolyzable silane compound. The heating in this method can be carried out at a liquid temperature of 50 to 180° C. To avoid evaporation or volatilization, the heating is preferably carried out, for example, under reflux in a closed vessel for 10 minutes to 12 hours.

The order of the procedures of the production of the hydrolysis-condensation product of the hydrolyzable silane may be such that a mixture of the organic solvent, water, and hydrolysis catalyst is added to the hydrolyzable silane compound to allow the reaction to take place or such that the hydrolyzable silane compound is added to a mixture of the organic solvent, water, and hydrolysis catalyst to allow the reaction to take place.

The reaction temperature in synthesis of the hydrolysis-condensation product of the hydrolyzable silane may be 0 to 50° C. in order to reliably synthesize a homogeneous polymer, and the reaction time can be 24 to 2000 hours.

The hydrolysis catalyst described above can be selected to control the silanol group content of the resulting hydrolysis-condensation product of the hydrolyzable silane. In general, when an acid is selected, a large amount of silanol groups remain, while selection of a base reduces the amount of the remaining silanol groups. An increase in silanol group content serves to increase the viscosity of the coating film-forming composition. The selection of the hydrolysis catalyst may be made to the extent that sufficient storage stability of the coating film-forming composition can be ensured.

Examples of the organic solvent used for the hydrolysis include toluene, methanol, ethanol, n-propanol, isopropanol, n-butanol, isobutanol, sec-butanol, t-butanol, diacetone alcohol, acetone, methyl ethyl ketone, methyl isobutyl ketone, cyclohexanone, ethylene glycol monomethyl ether, ethylene glycol monoethyl ether, diethylene glycol monomethyl ether, propylene glycol monomethyl ether, propylene glycol monoethyl ether, propylene glycol monomethyl ether acetate, propylene glycol propyl ether, γ-butyrolactone, n-propyl acetate, ethyl lactate, and N-methyl-2-pyrrolidone. These solvents can be used singly or in combination of two or more.

Among the above organic solvents, alcohols and organic solvents having high compatibility with alcohols are preferably used, because a hydrolysis reaction generally produces an alcohol. In particular, specific examples of such preferred organic solvents include methanol, ethanol, n-propanol, isopropanol, n-butanol, methyl ethyl ketone, ethylene glycol monomethyl ether, ethylene glycol monoethyl ether, diethylene glycol monomethyl ether, diethylene glycol monoethyl ether, propylene glycol monomethyl ether, propylene glycol monoethyl ether, propylene glycol monomethyl ether acetate, propylene glycol propyl ether, n-propyl acetate, ethyl lactate, and cyclohexanone.

As described above, the hydrolysis-condensation product (polysiloxane) as the component (A) is obtained by hydrolyzing a hydrolyzable silane in an organic solvent and allowing the hydrolysate to undergo condensation reaction. The condensation product is obtained in the form of a varnish of a polysiloxane dissolved in the organic solvent.

The polysiloxane varnish obtained may be subjected to solvent replacement. Specifically, when ethanol is selected as the organic solvent used for the hydrolysis and condensation reaction (this organic solvent will hereinafter be referred to as the "synthesis solvent"), a replacement solvent is added after the polysiloxane is obtained in ethanol, and ethanol is azeotropically distilled off using an evaporator or the like. Thus, solvent replacement with the replacement solvent can be accomplished. It is preferable for the synthesis solvent to have a lower boiling point than the replacement solvent, because the synthesis solvent is azeotropically distilled off in the solvent replacement. Examples of the synthesis solvent include methanol, ethanol, and isopropanol, and examples of the replacement solvent include propylene glycol monomethyl ether, propylene glycol monoethyl ether, propylene glycol monomethyl ether acetate, and cyclohexanone.

The polysiloxane varnish obtained can be concentrated to a solids concentration of 100% by distilling off the organic solvent, if the storage stability of the polysiloxane varnish is not poor.

An organic solvent used for, for example, dilution of the polysiloxane varnish may be the same or different from the organic solvent used for the hydrolysis reaction of the hydrolyzable silane. The diluting solvent is not particularly limited. One or more diluting solvents may be arbitrarily selected and used.

Specific examples of such diluting organic solvents include toluene, p-xylene, o-xylene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, isopropyl ether, 1,4-dioxane, N,N-dimethylformamide, N,N-dimethylacetamide, N-methyl-2-pyrrolidone, 1,3-dimethyl-2-imidazolidinone, dimethyl sulfoxide, and N-cyclohexyl-2-pyrrolidinone.

Among these, more preferred organic solvents include methanol, ethanol, isopropanol, butanol, diacetone alcohol, acetone, methyl ethyl ketone, methyl isobutyl ketone, ethylene glycol, propylene glycol, hexylene glycol, methyl cellosolve, ethyl cellosolve, butyl cellosolve, ethyl carbitol, butyl carbitol, diethylene glycol monomethyl ether, propylene glycol monomethyl ether, propylene glycol monomethyl ether acetate, propylene glycol monobutyl ether, cyclohexanone, methyl acetate, ethyl acetate, and ethyl lactate.

<Component (B)>

The fine inorganic particles contained as the component (B) in the coating film-forming composition according to the present invention comprise modified colloidal metal oxide particles (B3) having a primary particle diameter of 2 to 100 nm, the modified colloidal metal oxide particles (B3) including: colloidal metal oxide particles (B1) having a primary particle diameter of 2 to 60 nm and serving as core particles; and a coating material (B2) coating the surface of the colloidal metal oxide particles (B1) and including colloidal metal oxide particles having a primary particle diameter of 1 to 4 nm, wherein an amphiphilic organic silicon compound is bonded to the surface of the modified colloidal metal oxide particles (B3), the amphiphilic organic silicon compound having as a hydrophilic group at least one poly (oxyalkylene) group selected from polyoxyethylene group, polyoxypropylene group, or polyoxybutylene group and having as a hydrophobic group at least one group selected from a $C_{1-18}$ alkylene group or vinylene group.

In the present invention, the primary particle diameters of the colloidal particles can be measured by transmission electron microscope observation.

The colloidal metal oxide particles (B1) can be produced by a known method such as an ion exchange method, peptization method, hydrolysis method, or reaction method. Examples of the ion exchange method include a method in which an acidic metal salt is treated with a hydrogen ion exchange resin and a method in which a basic metal salt is treated with a hydroxy anion exchange resin. Examples of the peptization method include a method in which an acidic metal salt is neutralized with a base or a basic metal salt is neutralized with an acid to obtain a gel, the gel is washed, and then the gel is peptized with an acid or base. Examples of the hydrolysis method include a method in which a metal alkoxide is hydrolyzed and a method in which a basic metal salt is hydrolyzed under heating and then any unnecessary acid is removed. Examples of the reaction method include a method in which a metal powder and an acid are reacted.

The colloidal metal oxide particles (B1) are particles of an oxide of at least one metal selected from the group consisting of Ti, Fe, Cu, Zn, Y, Zr, Nb, Mo, In, Sn, Sb, Ta, W, Pb, Bi, and Ce. The colloidal metal oxide particles are particles of an oxide of a metal having a valence of 2 to 6, and examples of the metal oxide include $TiO_2$, $Fe_2O_3$, CuO, ZnO, $Y_2O_3$, $ZrO_2$, $Nb_2O_5$, $MoO_3$, $In_2O_3$, $SnO_2$, $Sb_2O_5$, $Ta_2O_5$, $WO_3$, PbO, and $Bi_2O_3$.

These metal oxides can be used singly or in combination. The way of combining the metal oxides is, for example, to mix two or more of the metal oxides, to form a composite of two or more of the metal oxides, or to form a solid solution in which two or more of the metal oxides are mixed at the atomic level.

Examples of the colloidal metal oxide particles include colloidal $SnO_2$—$WO_3$ composite particles resulting from combining $SnO_2$ particles and $WO_3$ particles via chemical bonds formed at the interface between the $SnO_2$ particles and $WO_3$ particles, colloidal $SnO_2$—$ZrO_2$ composite particles resulting from combining $SnO_2$ particles and $ZrO_2$ particles via chemical bonds formed at the interface between the $SnO_2$ particles and $ZrO_2$ particles, and colloidal $TiO_2$—$ZrO_2$—$SnO_2$ composite particles resulting from forming a solid solution in which $TiO_2$, $ZrO_2$, and $SnO_2$ are mixed at the atomic level. The colloidal metal oxide particles (B1) can be used in the form of a compound depending on the combination of the metal components, and examples of the compound include $ZnSb_2O_6$, $InSbO_4$, and $ZnSnO_3$.

In the present invention, the colloidal metal oxide particles (B1) are used as core particles, and the modified colloidal metal oxide particles (B3) are obtained by coating the surface of the colloidal metal oxide particles (B1) with the coating material (B2) including colloidal metal oxide particles having a primary particle diameter of 1 to 4 nm. The fine inorganic particles as the component (B) can be obtained by bonding, to the surface of the modified colloidal metal oxide particles (B3), an organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

The metal oxide used in the coating material (B2) is in the form of colloidal particles of an oxide of at least one metal selected from the group consisting of Si, Al, Sn, Zr, Mo, Sb, and W. Examples of the metal oxide used in the coating material (B2) include $SiO_2$, $Al_2O_3$, $SnO_2$, $ZrO_2$, $MoO_3$, $Sb_2O_5$, and $WO_3$. These metal oxides may be used singly or in combination. The way of combining the metal oxides is, for example, to mix two or more of the metal oxides, to form a composite of two or more of the metal oxides, or to form a solid solution in which two or more of the metal oxides are mixed at the atomic level.

Examples of the colloidal metal oxide particles include colloidal $SnO_2$—$WO_3$ composite particles resulting from combining $SnO_2$ particles and $WO_3$ particles via chemical bonds formed at the interface between the $SnO_2$ particles and $WO_3$ particles, colloidal $SnO_2$—$SiO_2$ composite particles resulting from combining $SnO_2$ particles and $SiO_2$ particles via chemical bonds formed at the interface between the $SnO_2$ particles and $SiO_2$ particles, colloidal $SnO_2$—$WO_3$—$SiO_2$ composite particles resulting from combining $SnO_2$ particles, $WO_3$ particles, and $SiO_2$ particles via chemical bonds formed at the interface among the $SnO_2$ particles, $WO_3$ particles, and $SiO_2$ particles, colloidal $SnO_2$—$MoO_3$—$SiO_2$ composite particles resulting from combining $SnO_2$ particles, $MoO_3$ particles, and $SiO_2$ particles via chemical bonds formed at the interface among the $SnO_2$ particles, $MoO_3$ particles, and $SiO_2$ particles, and colloidal $Sb_2O_5$—$SiO_2$ composite particles resulting from combining $Sb_2O_5$ particles and $SiO_2$ particles via chemical bonds formed at the interface between the $Sb_2O_5$ particles and $SiO_2$ particles.

The coating material (B2) can be formed by a known method such as an ion exchange method or oxidation method. Examples of the ion exchange method include a method in which an acidic salt of the metal mentioned above is treated with a hydrogen ion exchange resin. Examples of the oxidation method include a method in which a powder of the metal or metal oxide mentioned above and hydrogen peroxide are reacted.

Examples of the method for producing the modified colloidal metal oxide particles (B3) include the first and second methods described hereinafter.

The first method is a method in which an aqueous sol containing the colloidal metal oxide particles (B1) as core particles and an aqueous sol containing the coating material (B2) are mixed to obtain a mixed sol having a mass ratio (B2)/(B1), calculated on a metal oxide basis, of 0.05 to 0.5 and then the mixed sol is heated.

For example, an aqueous sol containing the colloidal metal oxide particles (B1) and an aqueous sol containing, as the coating material (B2), colloidal $Sb_2O_5$—$SiO_2$ composite particles having a mass ratio $Sb_2O_5/SiO_2$ of 0.1 to 5 are mixed to obtain a mixed sol having a mass ratio (B2)/(B1), calculated on a metal oxide basis, of 0.05 to 0.5, and then the mixed sol is heated at 70 to 350° C., giving a modified metal oxide sol containing the particles (B3) including the colloidal metal oxide particles (B1) as core particles and the colloidal $Sb_2O_5$—$SiO_2$ composite particles (B2) coating the surface of the colloidal metal oxide particles (B1).

The second method is a method in which an aqueous sol containing the colloidal metal oxide particles (B1) as core particles and an aqueous sol containing colloidal composite particles as the coating material (B2) are mixed and then the mixture is heated. The aqueous sol containing the colloidal composite particles as the coating material (B2) is obtained by mixing a water-soluble alkali metal stannate and a water-soluble alkali metal silicate to form a mixture having a mass ratio $SnO_2/SiO_2$, calculated on a metal oxide basis, of 0.1 to 5 and then by subjecting the mixture to cation exchange to remove the alkali metal ions. The aqueous solutions of water-soluble alkali metal salts which are used in the second method are preferably aqueous solutions of sodium salts.

For example, an aqueous sol containing the colloidal metal oxide particles (B1) and an aqueous sol containing colloidal $SnO_2$—$SiO_2$ composite particles as the coating material (B2), which is obtained by mixing an aqueous solution of sodium stannate and an aqueous solution of sodium silicate and subjecting the mixture to cation exchange, are mixed to prepare an aqueous sol having a mass ratio ($SnO_2$—$SiO_2$)/(B2), calculated on a metal oxide basis, of 0.05 to 0.5, and this aqueous sol is heated at 70 to 350° C. to give an aqueous sol containing the modified colloidal metal oxide particles (B3) including the colloidal metal oxide particles (B1) as core particles and the coating material (B2) coating the surface of the colloidal metal oxide particles (B1) and including the colloidal $SnO_2$—$SiO_2$ composite particles.

The mixing of the colloidal metal oxide particles (B1) and coating material (B2) can be carried out at a temperature of 1 to 100° C., preferably at room temperature to 60° C. The heating after mixing is carried out preferably at 70 to 350° C.

The sol of the modified colloidal metal oxide particles (B3) may contain any other component as long as the object of the present invention is achieved. In particular, when oxycarboxylic acids is contained in an amount of about 30% by mass or less based on the total amount of the metal oxides, a colloid with further improved properties such as high dispersibility can be obtained. Examples of the oxycarboxylic acid used include lactic acid, tartaric acid, citric acid, gluconic acid, malic acid, and glycol.

The sol of the modified colloidal metal oxide particles (B3) can contain an alkaline component, examples of which include: hydroxides of alkali metals such as Li, Na, K, Rb, and Cs; ammonia; primary to tertiary alkylamines such as ethylamine, isopropylamine, n-propylamine, n-butylamine, diethylamine, di-n-propylamine, diisopropylamine, di-n-butylamine, diisobutylamine, triethylamine, tripropylamine, tributylamine, triisobutylamine, triamylamine, tri-n-hexylamine, tri-n-octylamine, dimethylpropylamine, dimethylbutylamine, and dimethylhexylamine; aralkylamines such as benzylamine and dimethylbenzylamine; and alicyclic amines such as piperidine; alkanolamines such as monoethanolamine and triethanolamine; and quaternary ammonium salts such as tetramethylammonium hydroxide, tetraethylammonium hydroxide, and tetrapropylammonium hydroxide. One of these alkaline components may be contained alone or a mixture of two or more thereof may be contained. The alkaline component can be contained in an amount of about 30% by mass or less based on all metal oxides in the modified colloidal metal oxide particles (B3). The alkaline component can be used in combination with the oxycarboxylic acids as described above.

When the sol of the modified colloidal metal oxide particles (B3) is an aqueous sol, the aqueous medium of this aqueous sol can be replaced with a hydrophilic organic solvent to obtain an organic solvent sol. This replacement can be accomplished by a common method such as distillation or ultrafiltration. Examples of the hydrophilic organic solvent include: lower alcohols such as methyl alcohol, ethyl alcohol, and isopropyl alcohol; ethers such as propylene glycol monomethyl ether; linear amides such as dimethylformamide and N,N'-dimethylacetamide; and cyclic amides such as N-methyl-2-pyrrolidone; and glycols such as ethyl cellosolve and ethylene glycol.

The fine inorganic particles as the component (B) in the present invention comprise the modified colloidal metal oxide particles (B3) to the surface of which is bonded an amphiphilic organic silicon compound having as a hydrophilic group at least one poly(oxyalkylene) group selected from polyoxyethylene group, polyoxypropylene group, and polyoxybutylene group and having as a hydrophobic group at least one group selected from a $C_{1-18}$ alkylene group and vinylene group.

The number of moles of the polyoxyethylene group, polyoxypropylene group, or polyoxybutylene group added as the hydrophilic group is preferably 3 to 40 moles per molecule of the amphiphilic organic silicon compound.

Specific examples of the amphiphilic organic silicon compound used in the present invention include methoxytriethyleneoxypropyl trimethoxysilane, methoxytriethyleneoxyoctyl trimethoxysilane, methoxytriethyleneoxypropyl triethoxysilane, methoxytriethyleneoxypropyl tripropoxysilane, methoxytriethyleneoxypropyl triacetoxysilane, methoxytripropyleneoxypropyl trimethoxysilane, methoxytripropyleneoxyoctyl trimethoxysilane, methoxytripropyleneoxypropyl triethoxysilane, methoxytripropyleneoxypropyl tripropoxysilane, methoxytripropyleneoxypropyl triacetoxysilane, methoxytributyleneoxypropyl trimethoxysilane, methoxytributyleneoxyoctyl trimethoxysilane, methoxytributyleneoxypropyl triethoxysilane, methoxytributyleneoxypropyl tripropoxysilane, methoxytributyleneoxypropyl triacetoxysilane, methoxytriethyleneoxypropyl dimethoxymethylsilane, methoxytripropyleneoxy dimethoxymethylsilane, methoxytributyleneoxy dimethoxymethylsilane, methoxytriethyleneoxypropyl diethoxymethylsilane, methoxytripropyleneoxy diethoxymethylsilane, methoxytributyleneoxy diethoxymethylsilane, methoxytriethyleneoxypropyl dimethylmethoxysilane, methoxytripropyleneoxypropyl dimethylmethoxysilane, methoxytributyleneoxypropyl dimethylmethoxysilane, methoxytriethyleneoxypropyl dimethylethoxysilane, methoxytripropyleneoxypropyl dimethylethoxysilane, methoxytributyleneoxypropyl dimethylethoxysilane, bis-(methoxytriethyleneoxypropyl)dimethoxysilane, bis-(methoxytripropyleneoxypropyl)dimethoxysilane, bis-(methoxytributyleneoxypropyl)dimethoxysilane, [methoxy(poly(ethyleneoxy)$_n$)propyl]trimethoxysilane, [methoxy(poly(ethyleneoxy)$_n$)propyl]triethoxysilane, [methoxy(poly(ethyleneoxy)$_n$)propyl]tripropoxysilane, [methoxy(poly(ethyleneoxy)$_n$)propyl]triacetoxysilane, [methoxy(poly(propyleneoxy)$_n$)propyl]trimethoxysilane, [methoxy(poly(propyleneoxy)$_n$)propyl]triethoxysilane, [methoxy(poly(propyleneoxy)$_n$)propyl]tripropoxysilane, [methoxy(poly(propyleneoxy)$_n$)propyl]triacetoxysilane, [methoxy(poly(butyleneoxy)$_n$)propyl]trimethoxysilane, [methoxy(poly(butyleneoxy)$_n$)propyl]tripropoxysilane, [methoxy(poly(butyleneoxy)$_n$)propyl]triacetoxysilane, [methoxy(poly(ethyleneoxy)$_n$)propyl]dimethoxymethylsilane, [methoxy(poly(ethyleneoxy)$_n$)propyl]diethoxymethylsilane, [methoxy(poly(ethyleneoxy)$_n$)propyl]dipropoxymethylsilane, [methoxy(poly(ethyleneoxy)$_n$)propyl]diacetoxymethylsilane, [methoxy(poly(propyleneoxy)$_n$)propyl]dimethoxymethylsilane, [methoxy(poly(propyleneoxy)$_n$)propyl]diethoxymethylsilane, [methoxy(poly(propyleneoxy)$_n$)propyl]dipropoxymethylsilane, [methoxy(poly(propyleneoxy)$_n$)propyl]diacetoxymethylsilane, [methoxy(poly(butyleneoxy)$_n$)propyl]dimethoxymethylsilane, [methoxy(poly(butyleneoxy)$_n$)propyl]diethoxymethylsilane, [methoxy(poly(butyleneoxy)$_n$)propyl]dipropoxymethylsilane, and [methoxy(poly(butyleneoxy)$_n$)propyl]diacetoxymethylsilane (n=3 to 40).

The amount of the amphiphilic organic silicon compound bonded to the surface of the modified colloidal metal oxide particles (B3) is preferably 0.1 to 30% by mass and more preferably 1 to 15% by mass based on all metal oxides in the modified colloidal metal oxide particles (B3).

The fine inorganic particles as the component (B) in the present invention can be obtained by adding a predetermined amount of the amphiphilic organic silicon compound to an aqueous sol or hydrophilic organic solvent sol of the modified colloidal metal oxide particles (B3) and hydrolyzing the organic silicon compound with the aid of a catalyst such as dilute hydrochloric acid to bond the organic silicon compound to the surface of the modified colloidal metal oxide particles (B3).

The coating film-forming composition according to the present invention can further contain any other component as long as the object of the present invention is achieved. In particular, when phosphoric acid, a phosphoric acid derivative, a phosphoric acid surfactant, or an oxycarboxylic acid is contained in an amount of about 30% by mass or less based on all metal oxides in the modified colloidal metal oxide particles (B3), a coating film-forming composition in which the fine inorganic particles contained in the composition are better dispersed can be obtained. Examples of the phosphoric acid derivative that can be used include phenylphosphonic acid and metal salts thereof. Examples of the phosphoric acid surfactant include Disperbyk (BYK Japan K.K.), PHOSPHANOL (registered trademark) (TOHO Chemical Industry Co., Ltd.), and NIKKOL (registered trademark) (Nikko Chemicals Co., Ltd.). Examples of the oxycarboxylic acid include lactic acid, tartaric acid, citric acid, gluconic acid, malic acid, and glycol.

<Process for Producing Coating film-Forming Composition>

The present invention also concerns a process for producing a coating film-forming composition, comprising a step of mixing the following components (A) and (B).

(A) A hydrolysis-condensation product of at least one hydrolyzable silane of the following formula (1).

$$R^2{}_a Si(OR^1)_{4-a} \qquad \text{formula (1)}$$

In the formula, $R^1$ is a $C_{1-6}$ alkyl group, $R^2$ is a $C_{1-18}$ alkyl group or a $C_{6-18}$ aryl group, and a is an integer of 0 to 3.

(B) Fine inorganic particles comprising modified colloidal metal oxide particles (B3) having a primary particle diameter of 2 to 100 nm, the modified colloidal metal oxide particles (B3) including: colloidal metal oxide particles (B1) having a primary particle diameter of 2 to 60 run and serving as core particles; and a coating material (B2) coating the surface of the colloidal metal oxide particles (B1) and including colloidal metal oxide particles having a primary particle diameter of 1 to 4 run, wherein an amphiphilic organic silicon compound is bonded to the surface of the modified colloidal metal oxide particles (B3), the amphiphilic organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

Examples of the method for mixing the component (A) and the component (B) include:

(a) a method in which the component (A) in a solid state is mixed with a liquid dispersion of the component (B);

(b) a method in which a solution or dispersion of the component (A) in a medium such as an organic solvent is mixed with a liquid dispersion of the component (B); and (c) a method in which the component (A) in a solid state is added to and mixed with the component (B) during a step of dispersing the component (B) in a dispersion medium.

Among these methods, the method (b) is preferred for accomplishing the mixing because the procedures are easy.

As for the solvents used in the above production process, the solvent used for the component (A) and the solvent used for the component (B) may be the same or different as long as the stability of the coating film-forming composition according to the present invention is not impaired. When the solvents are different, the solvents are preferably similar in polarity.

Specific examples of the solvents used in the present invention include toluene, p-xylene, o-xylene, m-xylene, ethylbenzene, styrene, ethylene glycol dimethyl ether, propylene glycol monomethyl ether, ethylene glycol monomethyl ether, propylene glycol, propylene glycol monoethyl ether, ethylene glycol monoethyl ether, ethylene glycol monoisopropyl ether, ethylene glycol methyl ether acetate, propylene glycol monomethyl ether acetate, ethylene glycol ethyl ether acetate, diethylene glycol dimethyl ether, propylene glycol monobutyl ether, ethylene glycol monobutyl ether, diethylene glycol diethyl ether, dipropylene glycol monomethyl ether, diethylene glycol monomethyl ether, dipropylene glycol monoethyl ether, diethylene glycol monoethyl ether, triethylene glycol dimethyl ether, diethylene glycol monoethyl ether acetate, diethylene glycol, 1-octanol, ethylene glycol, hexylene glycol, trimethylene glycol, 1-methoxy-2-butanol, cyclohexanol, diacetone alcohol, furfuryl alcohol, tetrahydrofurfuryl alcohol, benzyl alcohol, 1,3-butanediol, 1,4-butanediol, 2,3-butanediol, γ-butyrolactone, acetone, methyl ethyl ketone, methyl isopropyl ketone, diethyl ketone, methyl isobutyl ketone, methyl n-butyl ketone, cyclohexanone, ethyl acetate, isopropyl acetate, n-propyl acetate, isobutyl acetate, n-butyl acetate, ethyl lactate, methanol, ethanol, isopropanol, tert-butanol, allyl alcohol, n-propanol, 2-methyl-2-butanol, isobutanol, n-butanol, 2-methyl-1-butanol, 1-pentanol, 2-methyl-1-pentanol, 2-ethylhexanol, 1-methoxy-2-propanol, tetrahydrofuran, 1,4-dioxane, N,N-dimethylformamide, N,N-dimethylacetamide, N-methyl-2-pyrrolidone, 1,3-dimethyl-2-imidazolidinone, dimethyl sulfoxide, and N-cyclohexyl-2-pyrrolidinone. These may be used singly or a mixture of two or more thereof may be used.

The coating film-forming composition according to the present invention may comprise a step of heating after the step of mixing the component (A) and the component (B). For example, the heating condition, after mixing of the component (A) and component (B), is 23° C. or higher, preferably 50° C. or higher, more preferably 70° C. or higher and is 150° C. or lower, preferably 140° C. or lower, more preferably 120° C. or lower. The heating time is preferably 1 to 48 hours. When the coating film-forming composition according to the present invention is obtained through heating, a film of uniform quality can be obtained in some cases.

The content of the component (B) in the coating film-forming composition according to the present invention may be in any range as long as the dispersibility in the coating film-forming composition obtained is not impaired. The content of the component (B) can be controlled appropriately depending on the intended refractive index, transmittance, and heat resistance of the coating film to be formed.

For example, when the solids content of the hydrolyzable silane hydrolysis-condensation product as the component (A) is defined as 100 parts by mass, the fine inorganic particles as the component (B) can be added in an amount of 0.1 to 1,500 parts by mass, preferably in an amount of 100 to 1,000 parts by mass. In particular, to ensure good film quality and obtain a stable refractive index, the amount of the fine inorganic particles added is more preferably 300 to 700 parts by mass. The solids content of the hydrolyzable silane hydrolysis-condensation product refers to the solids content after baking at 140° C.

The coating film-forming composition according to the present invention can further contain another component such as a surfactant, crosslinking agent, leveling agent, anti-settling agent, or emulsifier, as long as the effect of the present invention is not impaired.

Examples of the surfactant include nonionic surfactants such as: polyoxyethylene alkyl ethers such as polyoxyethylene lauryl ether, polyoxyethylene stearyl ether, polyoxyethylene cetyl ether, and polyoxyethylene oleyl ether; polyoxyethylene alkylaryl ethers such as polyoxyethylene octylphenol ether and polyoxyethylene nonylphenol ether;

polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; and polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate. Examples of the surfactant further include: fluorosurfactants such as Eftop (registered trademark) EF301, EF303, and EF352 available from Mitsubishi Materials Electronic Chemicals Co., Ltd. (formerly JEMCO), MEGAFACE (registered trademark) F171, F173, R-08, and R-30 available from DIC Corporation, Fluorad (registered trademark) FC430 and FC431 available from Sumitomo 3M Ltd., AsahiGuard (registered trademark) AG710 available from Asahi Glass Co., Ltd., and SURFLON (registered trademark) S-382, SC101, SC102, SC103, SC104, SC105, and SC106 available from Asahi Glass Co., Ltd.; organosiloxane polymer KP341 available from Shin-Etsu Chemical Co., Ltd.; and BYK-302, BYK-307, BYK-322, BYK-323, BYK-330, BYK-333, BYK-370, BYK-375, and BYK-378 available from BYK Japan K.K.

These surfactants may be used singly or in combination of two or more. The amount of the surfactant used is preferably 0.0001 to 5 parts by mass, more preferably 0.001 to 3 parts by mass, and even more preferably 0.01 to 1 parts by mass, based on 100 parts by mass of the component (A).

The crosslinking agent is not particularly limited and may be any compound having a substituent reactive with the component (A). Examples of such a compound include: melamine compounds having a crosslink-forming substituent such as methylol group or methoxymethyl group; substituted urea compounds; compounds containing a crosslink-forming substituent such as an epoxy group or oxetane group; compounds containing a blocked isocyanate group; compounds containing an acid anhydride group; compounds having (meth)acrylic group; and phenoplast compounds. From the viewpoint of heat resistance and storage stability, compounds containing an epoxy group, blocked isocyanate group, or (meth)acrylic group are preferred.

These crosslinking agents may be used singly or in combination of two or more. The amount of the crosslinking agent used is preferably 1 to 100 parts by mass based on 100 parts by mass of the component (A). To achieve a high refractive index, the upper limit of the amount of the crosslinking agent used is preferably 2 parts by mass and more preferably 5 parts by mass. When the crosslinking agent is used, the crosslinking agent can react with the reactive terminal silanol group of the component (A) to provide beneficial effects such as increase in film density, increase in heat resistance, and improvement in thermal relaxation performance.

The other component described above can be added in any step during preparation of the coating film-forming composition according to the present invention.

The coating film-forming composition according to the present invention can be applied to a substrate and, if necessary, subsequently baked to form a desired coating film. This coating film is also encompassed by the present invention.

Any method can be used to apply the coating film-forming composition according to the present invention, and examples of the method that can be used include spin coating, dipping, flow coating, inkjet coating, spraying, bar coating, gravure coating, slit coating, roll coating, transfer printing, brush coating, blade coating, and air knife coating.

Examples of the substrate include substrates made of silicon, indium tin oxide (ITO)-coated glass, indium zinc oxide (IZO)-coated glass, polyethylene terephthalate (PET), plastic, glass, quartz, or ceramic. A flexible substrate, which has flexibility, can also be used.

The coating film-forming composition according to the present invention may be filtered before use. The effective area and material of the filter are not particularly limited, and the filtration may be performed depending on the end product.

After the coating film-forming composition is applied to the substrate, baking can be performed to evaporate the solvent. The baking temperature can be, for example, but not limited to, 40 to 400° C. In the baking, the temperature can be varied among two or more levels to allow the resulting film to be highly uniform without uneven thickness distribution or allow the reaction of the crosslinking agent or the like to proceed on the substrate.

The baking method is not particularly limited and, for example, the solvent can be evaporated using a hot plate or oven under an appropriate atmosphere such as under air, under an inert gas such as nitrogen, or under vacuum.

The baking conditions such as the baking temperature and baking time can be selected to be suitable for the production step of the electronic device as an end product. The baking conditions can be selected so as to allow the resulting film to have physical property indices meeting the property requirements imposed on the electronic device.

The film (coating film) thus obtained from the composition of the present invention can exhibit high heat resistance, high transparency, a high refractive index, high solubility, and small volume shrinkage and is therefore suitable for use as a member in production of an electronic device such as a liquid crystal display, organic electroluminescence (EL) display, optical semiconductor (LED) device, solid-state image sensor, organic thin-film solar cell, dye-sensitized solar cell, or organic thin-film transistor (TFT). Thus, the present invention encompasses: electronic devices or optical members including a substrate and a coating film formed on the substrate from the composition of the present invention; solid-state image sensors or charge-coupled devices having a complementary metal oxide semiconductor including the coating film; and embedded materials, planarizing materials, or microlens materials for solid-state image sensors.

EXAMPLES

Hereinafter, the present invention will be described in more detail with reference to Examples and Comparative Examples. The present invention is not limited to Examples given below. The measurement apparatuses used in Examples are as follows.

[GPC]

Apparatus: HLC-8200 GPC, available from Tosoh Corporation

Column: Shodex KF-804L+KF-805L

Column temperature: 40° C.

Solvent: Tetrahydrofuran (hereinafter referred to as THF)

Detector: UV (254 nm)

Calibration curve: Standard polystyrene

[Ultraviolet-visible spectrophotometer]

Apparatus: SHIMADZU UV-3600, available from Shimadzu Corporation

[Ellipsometer]

Apparatus: VASE, variable angle spectroscopic ellipsometer, available from J.A. Woollam Japan Corporation

[Viscosity]

Apparatus: E-type viscometer (20° C.), available from Told Sangyo Co., Ltd.

[Electron microscope]

Apparatus: S-4800, available from Hitachi High-Technologies Corporation

[Synthesis Example 1] Synthesis of Polysiloxane [S1] from Tetraethoxysilane 29.17 g (0.14 mol) of tetraethoxysilane and 116.66 g of propylene glycol monomethyl ether (hereinafter abbreviated as PGME) were placed in a 300-ml flask. While the mixture solution was stirred with a magnetic stirrer, 10.09 g of 0.01 mol/L hydrochloric acid was added dropwise to the mixture solution. After the dropwise addition, the flask was transferred to an oil bath adjusted to 100° C., and the contents of the flask were heated under reflux to allow the reaction to proceed for 240 minutes. Thereafter, the reaction solution was cooled to room temperature, and then 116.66 g of PGME was added to the reaction solution, which was then concentrated by distilling off ethanol produced as a reaction by-product, water, and hydrochloric acid under reduced pressure. Thus, a solution of a hydrolysis-condensation product (polymer) in PGME was obtained. Next, PGME was added so that the solid residue content at 140° C. would be 52% by mass. The polymer thus obtained was a varnish of a polysiloxane (abbreviated as S1) formed from tetraethoxysilane. The weight-average molecular weight Mw of S1 as determined by GPC based on polystyrene standards was 1823.

[Synthesis Example 2] Synthesis of Polysiloxane [S2] from Triethoxyphenylsilane

A polysiloxane (abbreviated as S2) was obtained by carrying out synthesis in the same manner as in Synthesis Example 1 except for changing the starting material from tetraethoxysilane to triethoxyphenylsilane and using 3.0 equivalents of pure water based on the silane monomer. The weight-average molecular weight Mw was 1251.

[Synthesis Example 3] Synthesis of Polysiloxane [S3] from 4-Biphenyltrimethoxysilane A polysiloxane (abbreviated as S3) was obtained by carrying out synthesis in the same manner as in Synthesis Example 1 except for changing the starting material from triethoxyphenylsilane used in Synthesis Example 2 to 4-biphenyltrimethoxysilane. The weight-average molecular weight Mw was 1546.

[Synthesis Example 4] Synthesis of Polysiloxane [S4] from Methyltriethoxysilane

A polysiloxane (abbreviated as S4) was obtained by carrying out synthesis in the same manner as in Synthesis Example 1 except for changing the starting material from triethoxyphenylsilane used in Synthesis Example 2 to methyltriethoxysilane. The weight-average molecular weight Mw was 2979.

[Synthesis Example 5] Synthesis of Polysiloxane [55] from Ethyltriethoxysilane

A polysiloxane (abbreviated as S5) was obtained by carrying out synthesis in the same manner as in Synthesis Example 1 except for changing the starting material from triethoxyphenylsilane used in Synthesis Example 2 to ethyltriethoxysilane. The weight-average molecular weight Mw was 2744.

[Synthesis Example 6] Synthesis of Polysiloxane [S6] from Propyltriethoxysilane

A polysiloxane (abbreviated as S6) was obtained by carrying out synthesis in the same manner as in Synthesis Example 1 except for changing the starting material from triethoxyphenylsilane used in Synthesis Example 2 to propyltriethoxysilane. The weight-average molecular weight Mw was 2154.

[Synthesis Example 7] Synthesis of Polysiloxane [S7] from Isobutyltriethoxysilane A polysiloxane (abbreviated as S7) was obtained by carrying out synthesis in the same manner as in Synthesis Example 1 except for changing the starting material from triethoxyphenylsilane used in Synthesis Example 2 to isobutyltriethoxysilane. The weight-average molecular weight Mw was 1560.

[Synthesis Example 8] Synthesis of Polysiloxane [S8] from n-Octyltriethoxysilane A polysiloxane (abbreviated as S8) was obtained by carrying out synthesis in the same manner as in Synthesis Example 1 except for changing the starting material from triethoxyphenylsilane used in Synthesis Example 2 to n-octyltriethoxysilane. The weight-average molecular weight Mw was 1371.

[Synthesis Example 9] Synthesis of Polysiloxane [S9] from 9-Phenanthryltrimethoxysilane A polysiloxane (abbreviated as S9) was obtained by carrying out synthesis in the same manner as in Synthesis Example 1 except for changing the starting material from triethoxyphenylsilane used in Synthesis Example 2 to 9-phenanthryltrimethoxysilane.

The weight-average molecular weight Mw was 1521.

[Synthesis Example 10] Synthesis of Polysiloxane [S10] from Dimethoxydimethylsilane A polysiloxane (abbreviated as S10) was obtained by carrying out synthesis in the same manner as in Synthesis Example 1 except for changing the starting material from tetraethoxysilane used in Synthesis Example 1 to dimethoxydimethylsilane and using 2.0 equivalents of pure water based on the silane monomer. The weight-average molecular weight Mw was 2516.

[Synthesis Example 11] Synthesis of Polymethyl Methacrylate [R1]

A 200-mL reaction flask was charged with 92 g of propylene glycol monomethyl ether acetate (PGMEA) and then with 20 g of methyl methacrylate and 3 g of azobisisobutyronitrile. Nitrogen purging was performed by introducing nitrogen into the flask for 5 minutes while the contents of the flask were stirred. After visual confirmation of complete dissolution of the solutes in the solution, the reaction was allowed to proceed at an internal temperature of 100° C. for 12 hours. Next, the reaction solution was poured into 575 g of methanol to precipitate a polymer. The resulting solid was separated and collected by filtration under reduced pressure, and the solid was then dried with a reduced-pressure dryer at 50° C. for 12 hours. The Mw of polymethyl methacrylate [R1] resulting from the drying was determined to be 3500 by GPC. R1 was dissolved in PGME added so that the solid residue content at 140° C. would be 52% by mass. A polymer solution was thus obtained.

[Synthesis Example 12] Synthesis of Polystyrene [R2]

A 200-mL reaction flask was charged with 92 g of propylene glycol monomethyl ether acetate (PGMEA) and then with 20 g of styrene and 3 g of azobisisobutyronitrile. Nitrogen purging was performed by introducing nitrogen into the flask for 5 minutes while the contents of the flask were stirred. After visual confirmation of complete dissolution of the solutes in the solution, the reaction was allowed to proceed at an internal temperature of 100° C. for 12 hours. Next, the reaction solution was poured into 575 g of methanol to precipitate a polymer. The resulting polymer was separated and collected by filtration under reduced pressure, and the polymer was then dried with a reduced-pressure dryer at 50° C. for 12 hours. The Mw of polystyrene [R2] resulting from the drying was determined to be 3810 by GPC. R2 was dissolved in PGME added so that the solid residue content at 140° C. would be 52% by mass. A polymer solution was thus obtained.

[Synthesis Example 13] Synthesis of Liquid Dispersion of Component (B)

A dispersion sol of titanium oxide-containing core particles (abbreviated as T1) as the component (B) was prepared in the manner described hereinafter.

<Preparation of Core Particles (B1)>

A 1-liter vessel was charged with 126.2 g of pure water, to which 17.8 g of metastannic acid (equivalent to 15 g of $SnO_2$), 284 g of titanium tetraisopropoxide (equivalent to 80 g of $TiO_2$), 84 g of oxalic acid dihydrate (equivalent to 70 g of oxalic acid), and 438 g of a 35% by mass aqueous solution of tetraethylammonium hydroxide were added under stirring. In the resulting mixture solution, the molar ratio of oxalic acid to titanium atoms was 0.78, and the molar ratio of tetraethylammonium hydroxide to titanium atoms was 1.04. 950 g of the mixture solution was held at 80° C. for 2 hours, and then held at a reduced pressure of 580 Torr for 2 hours. A titanium-containing mixture solution was thus prepared. The titanium-containing mixture solution prepared had a pH of 4.7 and a $TiO_2$ concentration of 8.4% by mass. 950 g of the titanium-containing mixture solution and 950 g of pure water were placed in a 3-liter autoclave vessel provided with a glass lining and were subjected to hydrothermal treatment at 140° C. for 5 hours. After cooling to room temperature, the hydrothermally treated solution was collected. This solution was a pale, milky white aqueous dispersion sol of colloidal titanium oxide particles. The obtained sol had a pH of 3.9, a $TiO_2$ concentration of 4.2% by mass, a tetraethylammonium hydroxide concentration of 4.0% by mass, an oxalic acid concentration of 1.8% by mass, and a particle diameter as determined by dynamic light scattering method of 16 nm. In transmission electron microscope observation of this sol, elliptical particles with a primary particle diameter of 5 to 15 nm were observed. The sol obtained was dried at 110° C. to give a powder, on which X-ray diffraction analysis was conducted to confirm that the powder consisted of rutile crystals. The colloidal titanium oxide particles obtained were used as titanium oxide-containing core particles (B1).

<Preparation of Coating Material (B2)>

Next, 27.9 g of an aqueous solution of sodium silicate (silicate soda No. 3, containing 34% by mass $SiO_2$; available from Fuji Kagaku CORP.) was diluted with 27.9 g of pure water, and 8.6 g of sodium stannate trihydrate (containing 55% by mass $SnO_2$; available from Showa Kako Corp.) was then added and dissolved in the diluted aqueous solution under stirring to obtain an aqueous sodium silicate-sodium stannate solution. 64.4 g of the aqueous sodium silicate-sodium stannate solution obtained was diluted with 411 g of pure water, and the diluted solution was passed through a column packed with a hydrogen cation exchange resin (Amberlite (registered trademark) IR-120B, available from ORGANO CORPORATION), and thus 570 g of an aqueous dispersion sol of colloidal silicon dioxide-tin dioxide composite particles was obtained (this sol had a pH of 2.7, contained 0.83% by mass $SnO_2$ and 1.67% by mass $SiO_2$, and had a mass ratio $SiO_2/SnO_2$ of 2.0). Next, 2.9 g of diisopropylamine was added to the obtained aqueous dispersion sol. The resulting sol was an alkaline aqueous dispersion sol of colloidal silicon dioxide-tin dioxide composite particles. The sol had a pH of 8.2, and the colloidal particles had a primary particle diameter of 5 nm or less. The colloidal silicon dioxide-tin dioxide composite particles obtained were used as the coating material (B2).

<Preparation of Modified Colloidal Metal Oxide Particles (B3)>

Next, 570 g of the coating material (B2) including colloidal silicon dioxide-tin dioxide composite particles was added to 1900 g of the titanium oxide-containing core particles (B1) under stirring, and the mixture was held at a temperature of 95° C. for 3 hours to obtain an aqueous sol of modified colloidal titanium oxide composite particles. Thereafter, the obtained aqueous sol of modified colloidal titanium oxide composite particles was passed through a column packed with a hydrogen cation exchange resin (Amberlite (registered trademark) IR-120B, available from ORGANO CORPORATION), and thus 2730 g of an acidic aqueous sol of modified colloidal titanium oxide composite particles was obtained. The obtained sol had a pH of 2.7 and a total metal oxide concentration of 4.0% by mass. To the obtained sol was added 2.2 g of diisobutylamine. At this instant, the pH of the sol was 4.5. Next, the resulting sol was placed and concentrated in an evaporator equipped with a recovery flask, and water was distilled off at 600 Torr along with the addition of methanol. Thus, 533 g of a methanol sol of modified colloidal titanium oxide particles (B3) to which diisobutylamine is bonded was obtained.

The methanol sol obtained had a specific gravity of 0.949, a viscosity of 1.2 mPa·s, a pH of 4.8 (as a result of dilution of the sol with the same mass of water), a total metal oxide concentration of 20.5% by mass, and a water content of 3.1%.

<Preparation of Fine Inorganic Particles (B) to which Organic Silicon Compound is Bonded>

To 533 g of the obtained methanol sol was added 5.5 g of polyether-modified silane (3-[methoxy(polyethyleneoxy)$_n$propyl]trimethoxysilane (n=5 to 15); available from Shin-Etsu Silicones under the trade name "X-12-641"), and the mixture was heated under reflux for 5 hours to bond the polyether-modified silane to the surface of the modified colloidal titanium oxide particles. Next, an evaporator was used to distill off methanol at 80 Torr along with the addition of propylene glycol monomethyl ether and replace methanol as the solvent with propylene glycol monomethyl ether. Thus, 270 g of a propylene glycol monomethyl ether sol of modified colloidal titanium oxide particles to the surface of which a polyether-modified silane is bonded was obtained. The obtained sol had a specific gravity of 1.353, a viscosity of 7.0 mPa·s, a total metal oxide concentration of 40.3% by mass, a primary particle diameter as determined by transmission electron microscope observation of 5 to 10 nm, and a particle diameter as determined by dynamic light scattering method of 9 nm. The amount of the polyether-modified silane bonded to the surface of the modified colloidal titanium oxide particles was 4.0% by mass based on the modified colloidal titanium oxide particles. The sol was then concentrated with an evaporator so that the solid residue content at 140° C. would be 52% by mass. A metal oxide sol (T1) as the component (B) was thus obtained.

[Synthesis Example 14] Synthesis of Metal Oxide Sol Not Classified as Component (B)

A dispersion sol of titanium oxide-containing core particles (abbreviated as T2) was prepared in the manner described hereinafter.

<Preparation of Colloidal Metal Oxide Particles>

A 1-liter vessel was charged with 126.2 g of pure water, to which 17.8 g of metastannic acid (equivalent to 15 g of $SnO_2$), 284 g of titanium tetraisopropoxide (equivalent to 80 g of $TiO_2$), 84 g of oxalic acid dihydrate (equivalent to 70 g of oxalic acid), and 438 g of a 35% by mass aqueous solution of tetraethylammonium hydroxide were added under stirring. In the resulting mixture solution, the molar ratio of oxalic acid to titanium atoms was 0.78, and the molar ratio of tetraethylammonium hydroxide to titanium atoms was 1.04. 950 g of the mixture solution was held at 80° C. for 2 hours, and then held at a reduced pressure of 580 Torr for 2 hours. A titanium-containing mixture solution was thus prepared. The titanium-containing mixture solution prepared had a pH of 4.7 and a $TiO_2$ concentration of 8.4% by mass. 950 g of the titanium-containing mixture solution and 950 g of pure water were placed in a 3-liter autoclave vessel provided with a glass lining and were subjected to hydrothermal treatment at 140° C. for 5 hours. After cooling to room temperature, the hydrothermally treated solution was collected. This solution was a pale, milky white aqueous sol of colloidal titanium oxide particles. The obtained sol had a pH of 3.9, a $TiO_2$ concentration of 4.2% by mass, a tetraethylammonium hydroxide concentration of 4.0% by mass, an oxalic acid concentration of 1.8% by mass, and a particle diameter as determined by dynamic light scattering method of 16 nm. In transmission electron microscope observation of this sol, elliptical particles with a primary particle diameter of 5 to 15 nm were observed. The sol obtained was dried at 110° C. to give a powder, on which X-ray diffraction analysis was conducted to confirm that the powder consisted of rutile crystals.

<Preparation of Colloidal Metal Oxide Particles for Use as Coating Material>

Next, 27.9 g of an aqueous solution of sodium silicate (silicate soda No. 3, containing 34% by mass $SiO_2$; available from Fuji Kagaku CORP.) was diluted with 27.9 g of pure water, and 8.6 g of sodium stannate trihydrate (containing 55% by mass $SnO_2$; available from Showa Kako Corp.) was then added and dissolved in the diluted aqueous solution under stirring to obtain an aqueous sodium silicate-sodium stannate solution. 64.4 g of the aqueous sodium silicate-sodium stannate solution obtained was diluted with 411 g of pure water, and the diluted solution was passed through a column packed with a hydrogen cation exchange resin (Amberlite (registered trademark) IR-120B), and thus 570 g of an aqueous sol of colloidal silicon dioxide-tin dioxide composite particles was obtained (this sol had a pH of 2.7, contained 0.83% by mass $SnO_2$ and 1.67% by mass $SiO_2$, and had a mass ratio $SiO_2/SnO_2$ of 2.0). Next, 2.9 g of diisopropylamine was added to the obtained aqueous sol. The resulting sol was an alkaline aqueous sol of colloidal silicon dioxide-tin dioxide composite particles. The sol had a pH of 8.2, and the colloidal particles had a primary particle diameter of 5 nm or less. The colloidal silicon dioxide-tin dioxide composite particles obtained were used as a coating material.

<Preparation of Modified Colloidal Metal Oxide Particles>

Next, 570 g of the coating material including colloidal silicon dioxide-tin dioxide composite particles was added to 1900 g of an aqueous sol of the titanium oxide-containing core particles under stirring, and the mixture was held at a temperature of 95° C. for 3 hours to obtain an aqueous sol of modified colloidal titanium oxide composite particles. Thereafter, the obtained aqueous sol of modified colloidal titanium oxide composite particles was passed through a column packed with a hydrogen cation exchange resin (Amberlite (registered trademark) IR-120B, available from ORGANO CORPORATION), and thus 2730 g of an acidic aqueous sol of modified colloidal titanium oxide composite particles was obtained. The obtained sol had a pH of 2.7 and a total metal oxide concentration of 4.0% by mass. To the obtained sol was added 2.2 g of diisobutylamine. At this instant, the pH of the sol was 4.5. Next, the resulting sol was placed and concentrated in an evaporator equipped with a recovery flask, and water was distilled off at 600 Torr along with the addition of methanol. Thus, 364 g of a methanol dispersion sol of modified colloidal titanium oxide particles was obtained.

The methanol dispersion sol obtained had a specific gravity of 1.062, a viscosity of 1.8 mPa·s, a pH of 4.8 (as a result of dilution of the sol with the same mass of water), a total metal oxide concentration of 30.5% by mass, and a water content of 1.0%. The sol was then concentrated with an evaporator so that the solid residue content at 140° C. would be 52% by mass. A metal oxide sol (T2) was thus obtained.

[2] Production of Coating Film-Forming Composition and Formation of Coating Film Example 1

(Preparation of SV1)

15.00 g of T1 obtained in Synthesis Example 13 was weighed into a 20 mL recovery flask, to which was added 1.5676 g of PGME followed by addition of 3.00 g of S1 obtained in Synthesis Example 1. The contents of the flask were mixed at room temperature to prepare a coating film-forming composition (SV1) whose solids concentration was 48% by mass after baking at 140° C.

(Preparation of SV1C)

10.00 g of SV1 was weighed into a 20 mL recovery flask, which was heated in an oil bath at 80° C. for 1 hour. After the heating, the flask was left to cool until the temperature of the contents decreased to 23° C. Thus, a heated coating film-forming composition SV was obtained.

(Viscosity Measurement)

For each of SV1 and SV1C, the initial viscosity was measured. SV1 and SV1C were each subjected to a test in which SV1 or SV1C was left at 23° C. for 30 days and then the viscosity of SV1 or SV1C left for 30 days was measured.

(Formation and Evaluation of Coating film)

SV1 or SV1C was applied onto a silicon substrate or quartz substrate by spin coating using a spin coater at 1000 rpm for 30 seconds, after which baking using a hot plate was performed at 80° C. for 1 minute and then at 230° C. for 5 minutes to obtain a coating film.

For the coating film obtained on the silicon substrate, the film thickness and the refractive index at a wavelength of 550 nm were measured using an ellipsometer. For the coating film obtained on the quartz substrate, the transmittance was measured, and the average transmittance at 400 nm to 800 nm was calculated.

The coating film obtained on the silicon substrate was examined also as to whether blushing or cracking was found by visual inspection. The rating "x" was given when blushing or cracking occurred, while the rating "○" was given when neither blushing nor cracking occurred.

Example 2

A coating film-forming composition (SV2) was prepared in the same manner as in Example 1 except for replacing S1 with S2, and SV2 was then heated in a manner as described in Example 1 to obtain a coating film-forming composition SV2C. For SV2 and SV2C, viscosity measurement, and formation and evaluation of coating films, were carried out in the same manner as in Example 1.

Example 3

A coating film-forming composition (SV3) was prepared in the same manner as in Example 1 except for replacing S1 with S3, and SV3 was then heated in a manner as described in Example 1 to obtain a coating film-forming composition SV3C. For SV3 and SV3C, viscosity measurement, and formation and evaluation of coating films, were carried out in the same manner as in Example 1.

Example 4

A coating film-forming composition (SV4) was prepared in the same manner as in Example 1 except for replacing S1 with S4, and SV4 was then heated in a manner as described in Example 1 to obtain a coating film-forming composition SV4C. For SV4 and SV4C, viscosity measurement, and formation and evaluation of coating films, were carried out in the same manner as in Example 1.

Example 5

A coating film-forming composition (SV5) was prepared in the same manner as in Example 1 except for replacing S1 with S5, and SV5 was then heated in a manner as described in Example 1 to obtain a coating film-forming composition SV5C. For SV5 and SV5C, viscosity measurement, and formation and evaluation of coating films, were carried out in the same manner as in Example 1.

Example 6

A coating film-forming composition (SV6) was prepared in the same manner as in Example 1 except for replacing S1 with S6, and SV6 was then heated in a manner as described in Example 1 to obtain a coating film-forming composition SV6C. For SV6 and SV6C, viscosity measurement, and formation and evaluation of coating films, were carried out in the same manner as in Example 1.

Example 7

A coating film-forming composition (SV7) was prepared in the same manner as in Example 1 except for replacing S1 with S7, and SV7 was then heated in a manner as described in Example 1 to obtain a coating film-forming composition SV7C. For SV7 and SV7C, viscosity measurement, and formation and evaluation of coating films, were carried out in the same manner as in Example 1.

Example 8

A coating film-forming composition (SV8) was prepared in the same manner as in Example 1 except for replacing S1 with S8, and SV8 was then heated in a manner as described in Example 1 to obtain a coating film-forming composition SV8C. For SV8 and SV8C, viscosity measurement, and formation and evaluation of coating films, were carried out in the same manner as in Example 1.

Example 9

A coating film-forming composition (SV9) was prepared in the same manner as in Example 1 except for replacing S1 with S9, and SV9 was then heated in a manner as described in Example 1 to obtain a coating film-forming composition SV9C. For SV9 and SV9C, viscosity measurement, and formation and evaluation of coating films, were carried out in the same manner as in Example 1.

Example 10

A coating film-forming composition (SV10) was prepared in the same manner as in Example 1 except for replacing S1 with S10, and SV10 was then heated in a manner as described in Example 1 to obtain a coating film-forming composition SV10C. For SV10 and SV10C, viscosity measurement, and formation and evaluation of coating films, were carried out in the same manner as in Example 1.

Example 11

15.00 g of T1 obtained in Synthesis Example 13 was weighed into a 20 mL recovery flask, to which were added 0.31 g of PGME and 0.47 g of γ-butyrolactone followed by addition of 3.00 g of S1 obtained in Synthesis Example 1 and 0.06 g of BYK-307 as a surfactant. The contents of the flask were mixed at room temperature to prepare a coating film-forming composition (SV11) whose solids concentration was 50% by mass after baking at 140° C.

SV11 obtained was heated in a manner as described above to obtain a coating film-forming composition SV11C.

For SV11 and SV11C, viscosity measurement, and formation and evaluation of coating films, were carried out in the same manner as in Example 1.

For Examples 1 to 11, Table 1 shows the evaluation results of film thickness, refractive index, transmittance, viscosity, viscosity stability during storage, and occurrence of blushing and cracking.

Comparative Example 1

15.00 g of T2 obtained in Synthesis Example 14 was weighed into a 20 mL recovery flask, to which was added 1.5676 g of PGME followed by addition of 3.00 g of S1 obtained in Synthesis Example 1. Thus, a coating film-forming composition (RV1) whose solids concentration was 48% by mass after baking at 140° C. was prepared.

(Viscosity Measurement)

The initial viscosity of RV1 was measured. RV1 was subjected to a test in which RV1 was left at 23° C. for 30 days and then the viscosity of RV1 left for 30 days was measured.

(Formation and Evaluation of Coating film)

RV1 was applied onto a silicon substrate by spin coating using a spin coater at 1000 rpm for 30 seconds, after which baking using a hot plate was performed at 80° C. for 1 minute and then at 230° C. for 5 minutes to obtain a coating film. The coating film obtained on the silicon substrate was examined as to whether blushing or cracking was found by visual inspection. The rating "x" was given when blushing or cracking occurred, while the rating "○" was given when neither blushing nor cracking occurred.

Comparative Example 2

Preparation and viscosity measurement of a coating film-forming composition (RV2) were performed in the same manner as in Comparative Example 1 except for replacing S1 with S2, and formation and evaluation of a coating film were also carried out in the same manner as in Comparative Example 1.

Comparative Example 3

Preparation and viscosity measurement of a coating film-forming composition (RV3) were performed in the same manner as in Comparative Example 1 except for replacing S1 with S3, and formation and evaluation of a coating film were also carried out in the same manner as in Comparative Example 1.

Comparative Example 4

Preparation and viscosity measurement of a coating film-forming composition (RV4) were performed in the same manner as in Comparative Example 1 except for replacing S1 with S4, and formation and evaluation of a coating film were also carried out in the same manner as in Comparative Example 1.

Comparative Example 5

Preparation and viscosity measurement of a coating film-forming composition (RV5) were performed in the same manner as in Comparative Example 1 except for replacing S1 with S5, and formation and evaluation of a coating film were also carried out in the same manner as in Comparative Example 1.

Comparative Example 6

Preparation and viscosity measurement of a coating film-forming composition (RV6) were performed in the same manner as in Comparative Example 1 except for replacing S1 with S6, and formation and evaluation of a coating film were also carried out in the same manner as in Comparative Example 1.

Comparative Example 7

Preparation and viscosity measurement of a coating film-forming composition (RV7) were performed in the same manner as in Comparative Example 1 except for replacing S1 with S7, and formation and evaluation of a coating film were also carried out in the same manner as in Comparative Example 1.

Comparative Example 8

Preparation and viscosity measurement of a coating film-forming composition (RV8) were performed in the same manner as in Comparative Example 1 except for replacing S1 with S8, and formation and evaluation of a coating film were also carried out in the same manner as in Comparative Example 1.

Comparative Example 9

Preparation and viscosity measurement of a coating film-forming composition (RV9) were performed in the same manner as in Comparative Example 1 except for replacing S1 with S9, and formation and evaluation of a coating film were also carried out in the same manner as in Comparative Example 1.

Comparative Example 10

Preparation and viscosity measurement of a coating film-forming composition (RV10) were performed in the same manner as in Comparative Example 1 except for replacing S1 with S10, and formation and evaluation of a coating film were also carried out in the same manner as in Comparative Example 1.

For Comparative Examples 1 to 10, Table 1 shows the evaluation results of viscosity, viscosity stability during storage, and occurrence of blushing and cracking.

TABLE 1

| | Name of varnish | Film thickness [μm] | Refractive index | Transmittance [%] | Cracking | Blushing | Initial viscosity [mPa · s] | Viscosity after 30 days [mPa · s] |
|---|---|---|---|---|---|---|---|---|
| Example 1 | SV1 | 2.85 | 1.855 | 99.7 | ○ | ○ | 10.0 | 10.1 |
| | SV1C | 3.10 | 1.856 | 99.7 | ○ | ○ | 15.3 | 15.4 |
| Example 2 | SV2 | 2.90 | 1.860 | 99.6 | ○ | ○ | 10.4 | 10.4 |
| | SV2C | 3.13 | 1.860 | 99.6 | ○ | ○ | 15.9 | 16.0 |
| Example 3 | SV3 | 2.97 | 1.877 | 99.1 | ○ | ○ | 12.7 | 12.7 |
| | SV3C | 3.23 | 1.878 | 99.0 | ○ | ○ | 18.9 | 19.0 |
| Example 4 | SV4 | 2.91 | 1.856 | 99.7 | ○ | ○ | 10.6 | 10.6 |
| | SV4C | 3.15 | 1.857 | 99.7 | ○ | ○ | 16.2 | 16.2 |
| Example 5 | SV5 | 2.92 | 1.854 | 99.7 | ○ | ○ | 10.7 | 10.7 |
| | SV5C | 3.17 | 1.854 | 99.7 | ○ | ○ | 16.4 | 16.4 |

TABLE 1-continued

| | Name of varnish | Film thickness [μm] | Refractive index | Transmittance [%] | Cracking | Blushing | Initial viscosity [mPa · s] | Viscosity after 30 days [mPa · s] |
|---|---|---|---|---|---|---|---|---|
| Example 6 | SV6 | 2.93 | 1.852 | 99.7 | ○ | ○ | 10.8 | 10.8 |
| | SV6C | 3.19 | 1.852 | 99.7 | ○ | ○ | 16.5 | 16.5 |
| Example 7 | SV7 | 2.93 | 1.849 | 99.7 | ○ | ○ | 10.8 | 10.8 |
| | SV7C | 3.20 | 1.849 | 99.7 | ○ | ○ | 16.5 | 16.5 |
| Example 8 | SV8 | 2.94 | 1.844 | 99.7 | ○ | ○ | 11.1 | 11.1 |
| | SV8C | 3.21 | 1.844 | 99.7 | ○ | ○ | 16.8 | 16.8 |
| Example 9 | SV9 | 3.15 | 1.888 | 97.3 | ○ | ○ | 15.7 | 15.8 |
| | SV9C | 3.33 | 1.888 | 97.3 | ○ | ○ | 22.0 | 22.2 |
| Example 10 | SV10 | 2.92 | 1.850 | 99.7 | ○ | ○ | 10.7 | 10.7 |
| | SV10C | 3.15 | 1.851 | 99.7 | ○ | ○ | 16.2 | 16.2 |
| Example 11 | SV11 | 2.95 | 1.855 | 99.7 | ○ | ○ | 9.5 | 9.5 |
| | SV11C | 3.17 | 1.855 | 99.7 | ○ | ○ | 14.5 | 14.5 |
| Comparative Example 1 | RV1 | — | — | — | X | X | 9.6 | Gelated |
| Comparative Example 2 | RV2 | — | — | — | X | X | 9.9 | 53.2 |
| Comparative Example 3 | RV3 | — | — | — | X | X | 10.2 | 55.7 |
| Comparative Example 4 | RV4 | — | — | — | X | X | 9.7 | 254.1 |
| Comparative Example 5 | RV5 | — | — | — | X | X | 9.8 | 220.4 |
| Comparative Example 6 | RV6 | — | — | — | X | X | 9.8 | 198.4 |
| Comparative Example 7 | RV7 | — | — | — | X | X | 10.0 | 156.1 |
| Comparative Example 8 | RV8 | — | — | — | X | X | 10.4 | 128.9 |
| Comparative Example 9 | RV9 | — | — | — | X | X | 13.7 | 60.2 |
| Comparative Example 10 | RV10 | — | — | — | X | X | 9.8 | 109.9 |

Coating films used in electronic devices are required to be free of blushing and cracking.

Coating film-forming compositions are required not to undergo change in viscosity over time during storage at room temperature. This is because an aimed film thickness will not be obtained due to an increase viscosity of a coating film-forming composition over time, resulting in a decrease in production yield.

As seen from the results shown in Table 1 for Examples 1 to 11, the coating films formed from coating film-forming compositions according to the present invention did not show blushing or cracking despite having a thickness as large as about 3 μm. By contrast, in Comparative Examples 1 to 10, the obtained coating films suffered blushing and cracking and were not able to be subjected to measurement of film thickness, refractive index, and transmittance.

As for the storage stability of coating film-forming compositions which was evaluated on the basis of initial viscosity and viscosity after 30-day storage, the coating film-forming compositions according to the present invention underwent little change in viscosity even after being stored at 23° C. for 30 days and showed no significant change in viscosity also after being heated, which demonstrated that the coating film-forming compositions according to the present invention had good storage stability. By contrast, in xComparative Examples 1 to 10, the coating film-forming compositions showed a significant change in viscosity over time during storage at 23° C., and one of the coating film-forming compositions turned into a gel during the storage. Thus, the coating film-forming compositions of Comparative Examples 1 to 10 had poor storage stability.

Furthermore, the coating films obtained in Examples 1 to 11 were coating films of high refractive index and high transparency that exhibited a refractive index of about 1.85 at a wavelength of 550 nm and an average transmittance of 95% or more at a wavelength of 400 nm to 800 nm.

Investigation as to Binder Polymer

Comparative Example 11

A coating film-forming composition was prepared in the same manner as in Example 1, except for replacing S1 with R1 obtained in Synthesis Example 11. A solid was precipitated in the coating film-forming composition, and the resulting coating film-forming composition was not homogeneous.

Comparative Example 12

A coating film-forming composition was prepared in the same manner as in Example 1, except for replacing S1 with R2 obtained in Synthesis Example 12. A solid was precipitated in the coating film-forming composition, and the resulting coating film-forming composition was not homogeneous.

Comparison of Examples 1 to 11 with Comparative Examples 11 and 12 revealed that the polysiloxanes used in Examples are suitable as a binder polymer to obtain a homogeneous coating film-forming composition. It was also confirmed that when an acrylic polymer is selected as a binder polymer, the compatibility of the polymer is so low that a homogeneous coating film-forming composition cannot be obtained.

[3] Conditions of Heating of Coating Film-Forming Composition

As previously stated, when a coating film-forming composition according to the present invention is subjected to a heating step, a film of uniform quality may be obtained from the composition. Thus, coating film-forming compositions each weighed 10 g were individually placed in a 20 mL recovery flask and subjected to heating steps under various heating conditions, and the stability of the coating film-forming compositions was examined.

Examples 12 to 31 and Examples 32 to 35

SV1 to SV10 were each heated with an oil bath set at 110° C., 150° C., or 160° C. for 1 hour, and each coating film-forming composition was examined. No precipitate was found in any of the coating film-forming compositions, and the resulting coating film-forming compositions were non-gelled and homogeneous.

Comparative Examples 13 to 27

SV1 to SV10 were each heated with an oil bath set at 170° C. for 1 hour, and each coating film-forming composition was examined. Needle-shaped crystals were precipitated in the coating film-forming compositions, and the resulting coating film-forming compositions were not homogenous.

Table 2 shows the results for Examples 12 to 35 and Comparative Examples 13 to 27.

In the table, the rating "○" indicates that a homogeneous coating film-forming composition was obtained, while the rating "x" indicates that needle-shaped crystals were formed and a homogeneous coating film-forming composition was not obtained.

TABLE 2

| Name of varnish | Heating conditions | | | |
|---|---|---|---|---|
| | 110° C. | 150° C. | 160° C. | 170° C. |
| SV1 | Example 12 (○) | Example 22 (○) | Comparative Example 23 (X) | Comparative Example 13 (X) |
| SV2 | Example 13 (○) | Example 23 (○) | Example 32 (○) | Comparative Example 14 (X) |
| SV3 | Example 14 (○) | Example 24 (○) | Example 33 (○) | Comparative Example 15 (X) |
| SV4 | Example 15 (○) | Example 25 (○) | Example 34 (○) | Comparative Example 16 (X) |
| SV5 | Example 16 (○) | Example 26 (○) | Example 35 (○) | Comparative Example 17 (X) |
| SV6 | Example 17 (○) | Example 27 (○) | Comparative Example 24 (X) | Comparative Example 18 (X) |
| SV7 | Example 18 (○) | Example 28 (○) | Comparative Example 25 (X) | Comparative Example 19 (X) |
| SV8 | Example 19 (○) | Example 29 (○) | Comparative Example 26 (X) | Comparative Example 20 (X) |
| SV9 | Example 20 (○) | Example 30 (○) | Example 34 (○) | Comparative Example 21 (X) |
| SV10 | Example 21 (○) | Example 31 (○) | Comparative Example 27 (X) | Comparative Example 22 (X) |

As seen from Table 2, any of the coating film-forming compositions according to present invention did not show formation of needle-shaped crystals when heated at 150° C. or lower, and the resulting coating film-forming compositions were homogeneous. This confirmed that it is appropriate for the coating film-forming compositions of Examples to be subjected to a heating step at a temperature of 150° C. or lower.

However, in the case of heating at 170° C., all of the coating film-forming compositions showed precipitation of needle-shaped crystals, with the result that homogeneous coating film-forming compositions were not obtained.

It is not preferable that needle-shaped crystals be formed in a coating film-forming composition as in Comparative Examples 13 to 27, because the formation of needle-shaped crystals changes the dispersion state of the particles in the coating film-forming composition, leading to a failure to obtain a desired coating film.

INDUSTRIAL APPLICABILITY

In the coating film-forming composition according to the present invention, fine inorganic particles maintain high dispersibility. Thus, the coating film-forming composition has good storage stability and long product life, which eventually allows a reduction in cost.

Additionally, the coating film-forming composition can be used to obtain a high-refractive-index and highly transparent coating film free of blushing and cracking, along with ensuring a large thickness of the film. The coating film-forming composition is therefore suitable for use in electronic devices and optical members which need to have a thick coating film.

The coating film-forming composition according to the present invention is suitable for use in a member in production of an electronic device such as a liquid crystal display, organic electroluminescence (OLED) display, optical semiconductor (LED) device, solid-state image sensor, organic thin-film solar cell, dye-sensitized solar cell, or organic thin-film transistor (TFT). The coating film-forming composition is suitable also for use in a lens member required to have a high refractive index. In particular, the coating film-forming composition is suitable for use in a member for solid-state image sensors which is required to have a high refractive index, and examples of such a member include: an embedded film and planarizing film on a photodiode; planarizing films on both sides of a color filter; a microlens; and a planarizing film and conformal film on a microlens.

The invention claimed is:

1. A coating film-forming composition comprising the following components (A) and (B):
   (A) a hydrolysis-condensation product of at least one hydrolyzable silane of the following formula (1):

$R^2{}_a Si(OR^1)_{4-a}$      formula (1)

wherein $R^1$ is a $C_{1-6}$ alkyl group, $R^2$ is a $C_{1-18}$ alkyl group or a $C_{6-18}$ aryl group, and a is an integer of 0 to 3; and
   (B) fine inorganic particles including modified colloidal metal oxide particles (B3) having a primary particle diameter of 2 to 100 nm, the modified colloidal metal oxide particles (B3) including: colloidal metal oxide particles (B1) having a primary particle diameter of 2 to 60 nm and serving as core particles; and a coating material (B2) coating the surface of the colloidal metal oxide particles (B1) and including colloidal metal oxide particles having a primary particle diameter of 1 to 4 nm, wherein an amphiphilic organic silicon compound is bonded to the surface of the modified colloidal metal oxide particles (B3), the amphiphilic organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

2. The coating film-forming composition according to claim 1, wherein in the formula (1), $R^2$ is methyl group, ethyl group, phenyl group, biphenyl group, or phenanthryl group, and a is 1.

3. The coating film-forming composition according to claim 1, wherein in the amphiphilic organic silicon compound, the number of moles of the oxyalkylene group as the hydrophilic group is 3 to 40 moles.

4. The coating film-forming composition according to claim 1, wherein a mass percentage of the amphiphilic organic silicon compound bonded to the surface of the modified colloidal metal oxide particles (B3) of the component (B) is 0.1 to 30% by mass based on all metal oxides in the modified colloidal metal oxide particles (B3).

5. The coating film-forming composition according to claim 1, wherein the colloidal metal oxide particles (B1) of the component (B) are an oxide of at least one metal selected from the group consisting of Ti, Fe, Cu, Zn, Y, Zr, Nb, Mo, In, Sn, Sb, Ta, W, Pb, Bi, and Ce.

6. The coating film-forming composition according to claim 1, wherein the coating material (B2) of the component (B) is an oxide of at least one metal selected from the group consisting of Si, Al, Sn, Zr, Mo, Sb, and W.

7. A process for producing a coating film-forming composition, comprising a step of mixing the following components (A) and (B):
(A) a hydrolysis-condensation product of at least one hydrolyzable silane of the following formula (1):

$$R^2_a Si(OR^1)_{4-a} \qquad \text{formula (1)}$$

wherein $R^1$ is a $C_{1-6}$ alkyl group, $R^2$ is a $C_{1-18}$ alkyl group or a $C_{6-18}$ aryl group, and a is an integer of 0 to 3; and
(B) fine inorganic particles comprising modified colloidal metal oxide particles (B3) having a primary particle diameter of 2 to 100 nm, the modified colloidal metal oxide particles (B3) including: colloidal metal oxide particles (B1) having a primary particle diameter of 2 to 60 nm and serving as core particles; and a coating material (B2) coating the surface of the colloidal metal oxide particles (B1) and including colloidal metal oxide particles having a primary particle diameter of 1 to 4 nm, wherein an amphiphilic organic silicon compound is bonded to the surface of the modified colloidal metal oxide particles (B3), the amphiphilic organic silicon compound having as a hydrophilic group at least one poly(oxyalkylene) group selected from polyoxyethylene group, polyoxypropylene group, or polyoxybutylene group and having as a hydrophobic group at least one group selected from a $C_{1-18}$ alkylene group or vinylene group.

8. The process for producing a coating film-forming composition according to claim 7, wherein in the formula (1), $R^2$ is methyl group, ethyl group, phenyl group, biphenyl group, or phenanthryl group, and a is 1.

9. The process for producing a coating film-forming composition according to claim 7, wherein in the amphiphilic organic silicon compound, the number of moles of the oxyalkylene group as the hydrophilic group is 3 to 40 moles.

10. The process for producing a coating film-forming composition according to claim 7, comprising a step of heating at 23° C. or higher and 150° C. or lower after the step of mixing the component (A) and the component (B).

11. A coating film obtained from the coating film-forming composition according to claim 1.

12. An electronic device comprising a substrate and a coating film according to claim 11 formed on the substrate.

13. An optical member comprising a substrate and a coating film according to claim 11 formed on the substrate.

14. A solid-state image sensor or charge-coupled device comprising a complementary metal oxide semiconductor comprising at least one layer of the coating film according to claim 11.

15. An embedded material, planarizing material, or microlens material for solid-state image sensors, including at least one layer of coating film according to claim 11.

* * * * *